(12) United States Patent
Rohe et al.

(10) Patent No.: US 8,102,506 B2
(45) Date of Patent: Jan. 24, 2012

(54) METHOD AND DEVICE FOR CONTROLLING A PLURALITY OF ACTUATORS AND AN ILLUMINATION DEVICE FOR LITHOGRAPHY

(75) Inventors: Thomas Rohe, Bopfingen (DE); Juergen Fischer, Heidenheim (DE); Florian Bach, Oberkochen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 670 days.

(21) Appl. No.: 12/146,186

(22) Filed: Jun. 25, 2008

(65) Prior Publication Data

US 2009/0002668 A1    Jan. 1, 2009

Related U.S. Application Data

(60) Provisional application No. 60/946,177, filed on Jun. 26, 2007.

(30) Foreign Application Priority Data

Jun. 26, 2007   (DE) .......................... 10 2007 029 638

(51) Int. Cl.
*G03B 27/42* (2006.01)
*G03B 27/54* (2006.01)

(52) U.S. Cl. .......................................... 355/53; 355/67
(58) Field of Classification Search .................... 355/53, 355/67; 359/291–294; 345/84, 100
See application file for complete search history.

(56) References Cited

U.S. PATENT DOCUMENTS

| 5,523,193 | A | * | 6/1996 | Nelson ........................... 430/311 |
| 5,530,482 | A | * | 6/1996 | Gove et al. .................... 348/441 |
| 5,670,977 | A | | 9/1997 | Chiu et al. |
| 5,677,703 | A | * | 10/1997 | Bhuva et al. .................... 345/84 |
| 6,356,340 | B1 | * | 3/2002 | Spence ........................... 355/53 |
| 7,053,987 | B2 | | 5/2006 | Mackey et al. |
| 7,061,582 | B2 | | 6/2006 | Zinn et al. |
| 7,154,587 | B2 | * | 12/2006 | Bleeker ........................... 355/67 |
| 7,209,275 | B2 | | 4/2007 | Latypov et al. |
| 2005/0024613 | A1 | | 2/2005 | Bleeker |
| 2005/0177326 | A1 | | 8/2005 | Sandstrom et al. |
| 2006/0285094 | A1 | | 12/2006 | Reijnen et al. |
| 2007/0097344 | A1 | | 5/2007 | Bleeker |

FOREIGN PATENT DOCUMENTS

| DE | 103 43 333 A1 | 4/2005 |
| DE | 10343333 | 6/2007 |
| EP | 914626 | 2/1998 |
| EP | 0914626 | 5/1999 |
| EP | 1801656 | 4/2005 |
| KR | 20070065849 | 6/2007 |
| WO | WO 98/04959 | 2/1998 |

* cited by examiner

*Primary Examiner* — Hung Henry Nguyen
(74) *Attorney, Agent, or Firm* — Fish & Richardson P.C.

(57) ABSTRACT

The present invention relates to a method and a device for controlling multiple actuators with a controller and multiple actuators controllable by the controller. At least several groups of actuators are individually controllable by the controller and to each actuator or each group of actuators is assigned at least one memory storage unit, which can store at least one parameter for controlling one or more actuators. At least two parameters are assigned to each actuator or each group of actuators, with one position of the actuator(s) being assigned to each of the parameters.

25 Claims, 3 Drawing Sheets

METHOD AND DEVICE FOR CONTROLLING A PLURALITY OF ACTUATORS AND AN ILLUMINATION DEVICE FOR LITHOGRAPHY

CROSS-REFERENCE TO RELATED APPLICATIONS

This application claims priority under 35 U.S.C. §119(e)(1) to U.S. Provisional Application No. 60/946,177, filed Jun. 26, 2007. This applications also claims priority under 35 U.S.C. §119 to German Patent Application DE 10 2007 029 638.1, filed Jun. 26, 2007. The content of both of these applications are hereby incorporated by reference.

FIELD

This disclosure relates to projection exposure systems for lithography and related projection devices and methods.

BACKGROUND

Microelectronic components, such as integrated circuits and micro-mechanical systems, can be manufactured using lithography systems in which light-sensitive coatings on substrates are exposed to light for the purpose of generating structures. Such lithography systems generally use imaging devices to transfer very small structures onto a radiation-sensitive or light-sensitive layer of a substrate (wafer). Such imaging devices include projection exposure systems in which the light from a light source (e.g., a laser) is directed to a mask, the so-called reticle, via an illumination system. The structures of the mask or reticle are projected onto the substrate bearing the light-sensitive layer via a projection objective. For the purpose of suitably illuminating the reticle, light modulation facilities (e.g., a multi-mirror array (MMA)) can be used in the illumination system to obtain a certain intensity distribution of the light in a pupil plane of the illumination system.

Spatial light modulation devices, so-called Spatial Light Modulators SLMs, can be used in lithography systems to effect amplitude distribution, phase distribution and/or polarization distribution of the radiation may be effected.

A maskless microlithography system can use a light modulation device in the form of a multi-mirror array. In such a maskless microlithography system, instead of a reticle being illuminated with a corresponding micro-structure, the structure to be projected is generated by the position of micro-mirrors of the multi-mirror array and the resultant intensity distribution of the light.

SUMMARY

The present disclosure relates to devices and methods for controlling multiple actuators. The actuators can, for example, be used for actuating components of a light modulation device, such as micro-mirrors of a multi-mirror array. In some embodiments, the device and method provide short switching times or fast cycle times for a very large number of components or actuators. In certain embodiments, the device and method are easily produced and the necessary outlay are kept low. In some embodiments, the device or the method can ensure that light modulation devices, such as multi-mirror arrays with multiple components, such as micro-mirrors, can be used flexibly for different tasks.

In some embodiments, parameters for positioning the actuators are stored in one or more memory storage units. The actuator can thus be actuated or positioned by retrieving memory from the memory storage unit(s). Local arrangement of the memory near the actuator(s) can reduce data transport. This arrangement can, for example, reduce the amount of data that is transmitted from a central or external control unit (controller) to the individual components of a light modulation device or to the mirrors of a multi-mirror array or their actuators.

Thus, instead of transmitting corresponding control signals from a central control unit to the plurality of actuators, the storing of corresponding parameters for actuating the actuators and thus positioning or aligning the associated light modulation components, such as micro-mirrors, avoids the need for transporting a large amount of data from a central control unit to the plurality of actuators. In this regard, depending on the needs and requirements, either each individual actuator can be assigned its own memory storage unit with different memory locations for at least two parameters, each of which corresponds to a position of the actuator, or multiple memory storage units may be provided for each actuator, with either one parameter corresponding to a position of the actuator or several parameters capable of being stored per memory storage unit. As a result, it is possible to store multiple preset positions of an actuator in corresponding memory storage units such that switching back and forth between these individual actuator positions can take place rapidly and in a simple manner. Instead of providing one or more memory storage units, each with one or more memory locations for one parameter each, groups of actuators could also be formed. In such cases, one or more memory storage units, each with one or more memory locations for relevant parameters, can be assigned to each group of actuators. The actuators can either be controlled by group or each actuator can be controlled individually. The actuators according to the present disclosure include a first set of actuators of a projection exposure system or a corresponding device. Other actuators (e.g., a second set of actuators) may additionally be present.

In some embodiments, those parameters which are stored are formed by the control signals for the actuators, such that the stored data, after having been read from the memory storage unit, can be used directly to control the actuator, without being subjected to time-consuming operations. For example, only a conversion of digital data into analog control signals may be required. This can facilitate rapid actuation of the actuators and the light modulation components which are operated by the actuators.

Should, for example, two actuators be provided for actuating a light modulation component, such as a micro-mirror, the parameters can include the two control signals for the two actuators. Insofar as, for example, four actuators are provided for rotating or swiveling a micro-mirror about two independent rotational axes, one parameter can accordingly include four control signals for the four actuators. Correspondingly, these four actuators may be combined into a group, to which a memory storage unit is read and assigned. The device can further include a control unit (controller), which can, for example, control which parameters from the memory storage units are used. However, the requisite amount of data is significantly reduced.

The controller of the light modulation device or the device for controlling a plurality of actuators, e.g. for actuating micro-mirrors of a multi-mirror array, can have a plurality of sub-controllers, which are coordinated by the master controller, but which independently assume control over the individual actuator or the several actuators assigned to them. In some embodiments, the controller and/or sub-controllers are formed as regulating units. In such embodiments, the sub-controllers can assume independent control over the actuator position, such that the requisite data transport is further reduced as a result. Insofar as the controller and/or sub-controllers are formed as regulating units, the device has corresponding measuring devices or sensors for capturing the necessary input parameters for the control loop. The controller and/or sub-controllers can be implemented as any of various types of regulating units, such as PID controllers.

The controller can have an integrated circuit (e.g., an application specific integrated circuit (ASIC)), which can include the memory storage units and/or the corresponding electronic components. The memory storage units and/or the corresponding electronic components can supply individual, several or all actuators with corresponding control signals.

In some embodiments, the memory storage units are directly integrated in the integrated circuit (e.g., the ASIC), such that direct control of the actuators is possible. In such embodiments, the parameters can have control signals and immediately after the reading—perhaps only via an analog-digital converter—be made available to the actuator for the purpose of actuation.

The memory storage units can be non-volatile memory storage units, which can preserve the memory contents, where no energy supply is available. This arrangement can be particularly advantageous when the device has to be shut off on short notice or the power supply is interrupted on short notice.

Suitable memory storage units include RAM, SRAM, DRAM, SDRAM, ROM, EPROM, EEPROM and FLASH memory. Certain other memory chips can also be used.

The actuators may be formed by an MEMS (Micro-Electro-Mechanical System) unit, which can be produced by lithographic processes. It is thus possible to produce the actuators, for example, together with the components of the light modulation device, such as the micro-mirrors, in one unit on a wafer. A corresponding circuit of the controller (e.g., an ASIC) can be provided on an opposite side of the same wafer. Such a configuration is called a 1-wafer system. Also possible are 2-wafer systems, in which an MEMS unit, e.g., with actuators and components of a light modulation device, is provided on one wafer, while a corresponding integrated circuit of the controller is arranged on a second wafer. The two wafers are functionally interconnected such that the actuators can be controlled via the ASIC. Similarly, 3-wafer, 4-wafer or multi-wafer systems can also be implemented in which a corresponding number of wafers with different components are combined into a functional unit.

The structure of the device with storage of parameters for switching actuators makes it possible to simply switch back and forth between two switching states of the actuator, without a lot of control data having to be transmitted from the central controller. In certain embodiments, only the parameters for the corresponding actuator, typically in the form of corresponding control signals, are read out from the memory storage units and transmitted to the actuator. This can be done in a simple manner using a local arrangement of memory storage units in the vicinity of the actuators. In addition to the resultant fast switching of the actuators, the storage of at least two position parameters makes it possible to achieve particularly flexible deployment of a corresponding device (e.g., a light modulation device) with components that can be actuated correspondingly, such as micro-mirrors. Thus, a new parameter for actuating or positioning the actuator can be loaded onto one of the memory locations, while the actuator is being actuated or operated in accordance with the parameter on another memory location. Since, for the multiple memory storage units, which are assigned to the respective actuators, the corresponding memory locations can be loaded or changed successively, the corresponding parameters for future switching processes with a low data flow rate can be loaded during operation. This makes for particularly flexible deployment.

This loading process can extend over a prolonged period. This loading process can, for example, extend over several cycles when the device is in cyclic operation.

The corresponding cyclic-like, rolling loading process of new or modified memory data from memory storage unit to memory storage unit or memory location to memory location can thus be carried out repeatedly. As a result, multiple actuator positions can be set successively without interruption to operation. Accordingly, for example, a lithography system or a projection exposure system can be set individually for future exposure operations, such that ultimately individual single exposures become possible.

In one aspect, a projection exposure system for microlithography includes multiple actuators and a device for controlling the multiple actuators with a controller. At least several groups of actuators can be controlled individually by the controller. Each actuator or each group of actuators of a first set of actuators includes at least one memory storage unit that can store at least one parameter for controlling one or more actuators. At least two parameters are assigned to each actuator or each group of actuators, with one position of the actuator(s) being assigned to each of the parameters.

In another aspect, a method includes controlling multiple actuators in a projection exposure system with a controller, wherein at least several groups of actuators can be controlled individually by the controller and at least one memory storage unit is assigned to each actuator or each group of actuators of a first set of actuators. For each actuator or each group of actuators of the first set of actuators, at least one parameter for controlling one or more actuators of the first set of actuators is stored in at least one assigned memory storage unit, such that at least two parameters are assigned to each actuator or each group of actuators of the first set of actuators, with one position of the actuator(s) being assigned to each of the parameters.

Embodiments can include one or more of the following features.

In some embodiments, the projection exposure system further includes a second set of actuators, where the actuators of the second set differ from the actuators of the first set.

In certain embodiments, each actuator is individually controllable via the controller.

In some embodiments, each actuator or each group of actuators of the first set of actuators is assigned at least one memory storage unit, which can store at least two parameters for controlling the actuator, with one position of the actuator(s) being assigned to each of the parameters.

In certain embodiments, two or more memory storage units are provided for each actuator or each group of actuators of the first set of actuators. The memory storage units can store one or more parameters for controlling the actuator(s), with one position of the actuator(s) being assigned to each of the parameters.

In some embodiments, the stored parameters are control signals for the actuators of the first set of actuators.

In certain embodiments, the stored parameters are control signals for one or more degrees of movement freedom of the actuators of the first set of actuators.

In some embodiments, the controller includes multiple sub-controllers, which correspond in number to the number of actuators or groups of actuators of the first set of actuators.

In certain embodiments, the controller and/or the sub-controllers are formed as regulating units.

In some embodiments, the controller includes an integrated circuit (e.g., an application specific integrated circuit ASIC), which supplies individual, several or all actuators with control signals.

In certain embodiments, the memory storage units are part of an integrated circuit (e.g., an application specific integrated circuit).

In some embodiments, the parameters stored in the memory storage units are directly available for controlling the actuators of the first set of actuators.

In certain embodiments, the memory storage units include non-volatile memory storage units.

In some embodiments, the memory storage units include RAM, SRAM, DRAM, SDRAM, ROM, EPROM, EEPROM, or FLASH memory.

In certain embodiments, the actuators of the first set of actuators are formed by a micro-electromechanical system (MEMS) unit.

In some embodiments, the device includes a 1-wafer system, a 2-wafer system, a 3-wafer system, a 4-wafer system or a multi-wafer system.

In certain embodiments, the actuators are part of a manipulation system for a projection device, a projection exposure system for micro-lithography, light modulators, spatial light modulators (SLMs), or multi-mirror arrays (MMAs).

In some embodiments, the actuators are provided in corresponding number for positioning mirror elements.

In certain embodiments, the actuators are adapted to position up to 4 million (e.g., up to 6 million, 4,000 to 1,000,000) mirrors. Each of the mirrors can be swivellable about at least two rotational axes.

In some embodiments, the device is provided in the illumination optics and/or the projection objective.

In certain embodiments, at least two parameters are stored in a memory storage unit or one or more parameters are each stored in several memory storage units assigned to an actuator or a group of actuators of the first set of actuators.

In some embodiments, at least some of the memory storage units of the multiple actuators are supplied with parameters during operation of the elements driven by the actuators.

In certain embodiments, in the case of cyclic or stepwise operation of the actuators, the memory storage units of the actuators are supplied with parameters for at least two or more cycles or steps.

In some embodiments, the memory storage units assigned to an actuator or a group of actuators of the first set of actuators are, during the operation or switching cycle of the actuator(s) with a first stored parameter value, loaded with a second parameter different from the first.

In certain embodiments, the memory storage units are loaded with parameters temporally in succession.

In some embodiments, the parameters are swapped in a cycle or repeating cycle in the memory storage units.

BRIEF DESCRIPTION OF THE FIGURES

Further advantages, characteristics and features of the present disclosure are apparent from the following detailed description of embodiments using the enclosed drawings. The drawings are in schematic form.

DETAILED DESCRIPTION

This disclosure relates to devices and methods for controlling multiple actuators. The devices and methods can be implemented in a projection device for microlithography or generally in a corresponding lithography arrangement.

Figure 1:
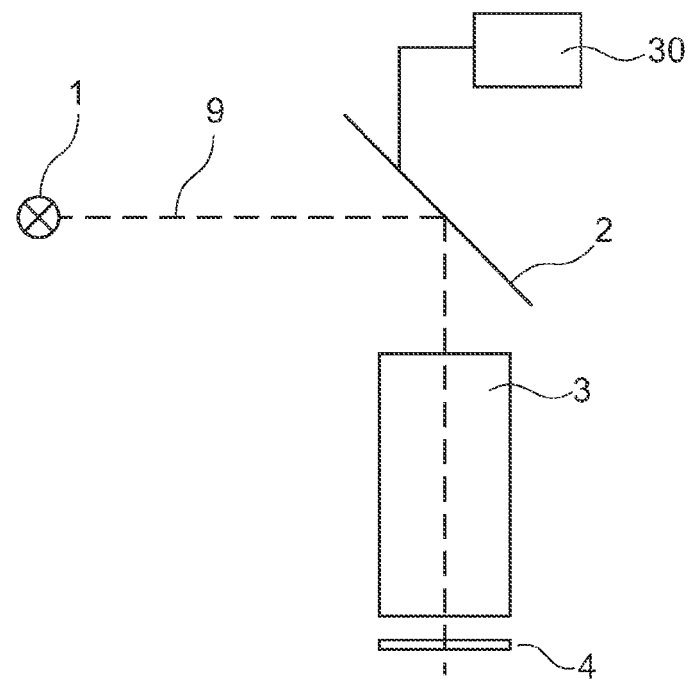
FIG. 1 illustrates a maskless lithography system.

FIG. 1 shows a schematic example of a lithography system in which light (or radiation) of a light source (or radiation source) 1 along an optical axis 9 falls onto a light modulation device in the form of a multi-mirror array (MMA) 2, which generates a structure or a pattern that is projected onto a wafer or substrate 4 with a radiation-sensitive layer via a projection lens 3.

The multi-mirror array 2 has multiple micro-mirrors which are controlled via a controller 30 so that their orientation and position may be set by actuators. A change in the position of the micro-mirrors of the multi-mirror array 2 can generate different patterns that are projected onto the wafer 4 via the projection lens 3.

Figure 2:
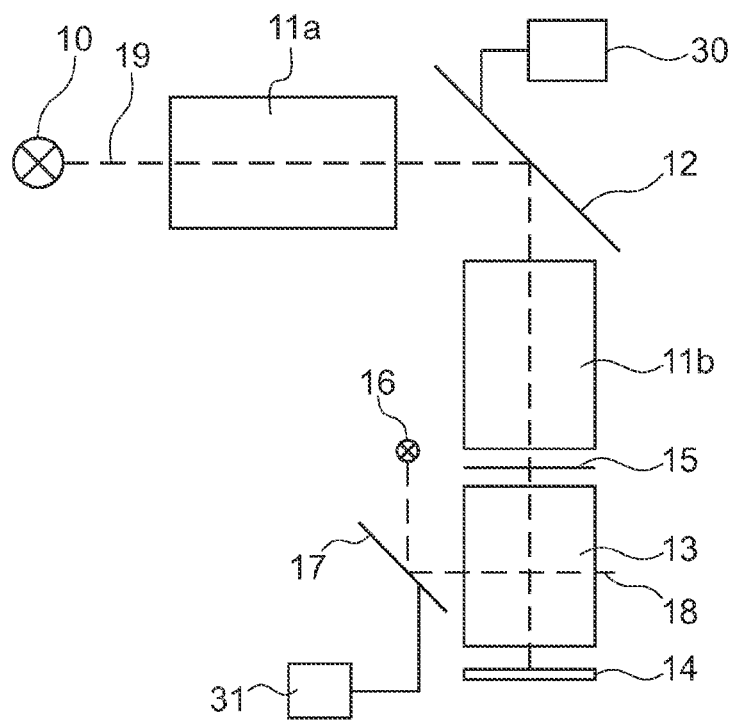
FIG. 2 illustrates a projection exposure system with a light modulation device in the illumination system of a reticle.

FIG. 2 shows a further application in a lithography system in which light (or radiation) of a light source (or radiation source) 10 is directed onto a reticle 15 via an illumination installation 11a, 11b, 12. The structure of the reticle 15 is projected onto a wafer 14 via a projection lens 13.

The illumination arrangement includes along an optical axis 19 two illumination optics 11a and 11b, between which is provided a light modulation device (e.g., a multi-mirror array (MMA)) 12. The multi-mirror array 12 is used to generate a variably adjustable intensity distribution of the radiation in a pupil plane of the illumination arrangement 11a, 11b, 12. The multi-mirror array 12 is controlled via a controller 30, such that the micro-mirrors of the multi-mirror array, through corresponding orienting and positioning, contribute to the desired intensity distribution of radiation in the pupil plane.

As shown in FIG. 2, a light modulation device (e.g., a multi-mirror array (MMA)) 17 directs light or radiation from an auxiliary light or radiation source 16 in line with an optical axis 18 onto an optical element of the projection objective 13. The auxiliary light of radiation can compensate for radiation-induced projection errors. Such errors can occur, for example, due to a non-uniform radiation distribution across the corresponding optical element of the projection objective 13. One such application, for example, is disclosed in German patent application DE 10 2007 014 699.1, whose contents are hereby fully incorporated by reference into the present application. The two other applications of light modulation devices, which are described in FIGS. 1 and 2, are described for example in DE 103 43 333 and EP 914626 or WO 98/04950 respectively, with their disclosure content also being fully incorporated by reference herein.

The light modulation device 17 in the form of a multi-mirror array is also controlled via a controller 31, which determines the position of the micro-mirrors in accordance with the requirements of the incident correction light.

Controllers 30, 31 can be used as control devices in which the set positions of the micro-mirrors are regulated as a function of measured positions in line with known control measures. Controllers 30, 31 can, for example, receive readings from sensors or the like that measure the position of the micro-mirrors. Similarly, measuring devices and sensors or the like (not shown) can also be provided.

Figure 3:
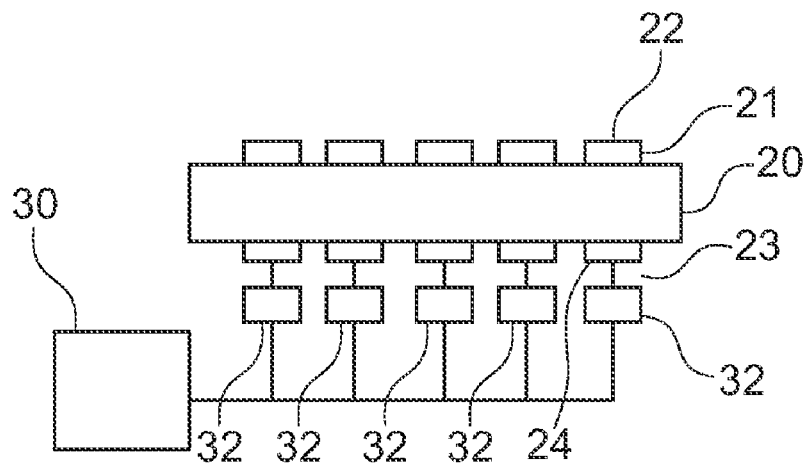
FIG. 3 is a side view of a device in a 1-wafer embodiment.
Figure 4:
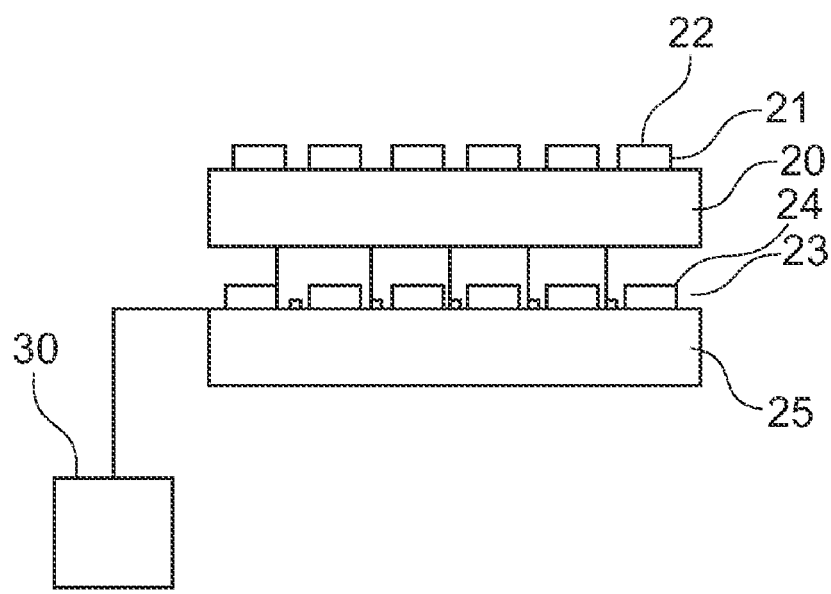
FIG. 4 is a side view of a device in a 2-wafer embodiment.

FIGS. 3 and 4 schematically show side views of devices that can be used in the lithography systems or projection exposure systems in FIG. 1 or FIG. 2. In addition, corresponding devices can also be used in the case of additional manipulators, which may be provided in projection devices, such as manipulators for aligning optical elements (e.g., lenses and the like). Such an arrangement can be particularly beneficial when multiple manipulators are to be controlled or regulated.

FIG. 3 shows a device in a so-called 1-wafer embodiment, in which the actuators 21 and the micro-mirrors 22 have been manufactured using so-called MEMS (Micro Electro-Mechanical System) technology. In some embodiments, the mechanical and/or electromechanical components (e.g., the electronic components of an integrated circuit) are generated by lithographic structuring. As a result, mechanical and/or electronic and electromechanical components can be produced in a simple manner on a single wafer 20. Similarly, the micro-mirrors 22 and the actuators 21 in the MEMS system of FIG. 3 can be formed directly on the same wafer (e.g., a silicon substrate) 20 together with an application specific integrated circuit (ASIC) 23, which is provided on the opposite side of the wafer 20. A functional connection between the ASIC 23 and the MEMS components 21, 22 is provided through the wafer 20 or via the corresponding end faces.

In accordance with the disclosure, the ASIC 23 contains multiple memory storage units 24, each one of which is assigned to one actuator 21. Each memory storage unit 24 has at least two memory locations for parameters, which correspond to positions or alignments of the micro-mirrors 22. In some embodiments, one parameter includes control signals for the actuator(s) 21 of a micro-mirror 22 of the multi-mirror array, such that control signals can be transmitted directly to the actuators 21 during reading of a parameter. As a result, the micro-mirrors 22 can have very short switching times.

In some embodiments, the memory storage units 24 are non-volatile memory storage units. This means that a permanent energy supply is not needed for retaining the memory state, i.e., for retaining the stored information. Instead, the memory storage units keep their memory information for a certain time even on shutdown or during a power interruption.

Connected to the ASIC 23 are sub-controllers 32, which in turn are connected to a master controller 30, for example, via a data bus. The sub-controllers 32, ASIC 23, and master controller 30 together form the controller for the multi-mirror array. The sub-controllers may be provided separately for each actuator or groups of actuators 21. The controller 30 and/or sub-controllers 32 can also be integrated in the ASIC 23.

Reading of the memory storage units 24 with the corresponding parameters is effected by the controller 30 or the sub-controllers 32 assigned to the individual micro-mirrors or actuators. For instance, the central controller 30 can transmit the command for aligning the various micro-mirrors 22 to the sub-controllers 32 via a bus system, whereupon the sub-controllers 32 select the control signals stored previously in the memory storage units 24 and, through direct provision from the memory 24 for the actuators 21, facilitate rapid switching of the mirrors 22. The local storage of the parameters for the position of the individual mirrors can decrease the amount of data being transmitted from the central controller 30 to the sub-controllers 32 and/or reduce processing in the sub-controllers 32.

In certain embodiments, as shown in FIG. 4, for example, the sub-controllers 32 are dispensed with entirely. It should be noted that it is also possible to dispense with the sub-controllers in the system of FIG. 3. The device of FIG. 4 is, with the exception of some differences, which are explained below, similar to the embodiment of FIG. 3. Thus, similar reference symbols are used for similar components.

The embodiment of FIG. 4 differs from that of FIG. 3 essentially in the fact that a 2-wafer design is implemented instead of a 1-wafer design. In this connection, wafer 20 corresponds to a multi-mirror array with multiple micro-mirrors 22, which can be actuated by multiple actuators assigned to the micro-mirrors. In contrast to the embodiment of FIG. 3, however, the application specific integrated circuit ASIC 23 is not provided on the wafer 20. Instead, the ASIC 23 is provided on a second separate wafer 25, which, for example, can also be formed from silicon. The two wafers 20 and 25 are then connected to each other directly to create a corresponding operative connection. This may be effected through direct wire bonding or adhesive bonding.

The ASIC 23 of the embodiment of FIG. 4 essentially corresponds to the ASIC 23 of the embodiment of FIG. 3, the difference being that the controller 30 has no sub-controllers 32, and that the commands are transmitted directly to the memory storage units 24 from the central controller 30.

Figure 5:
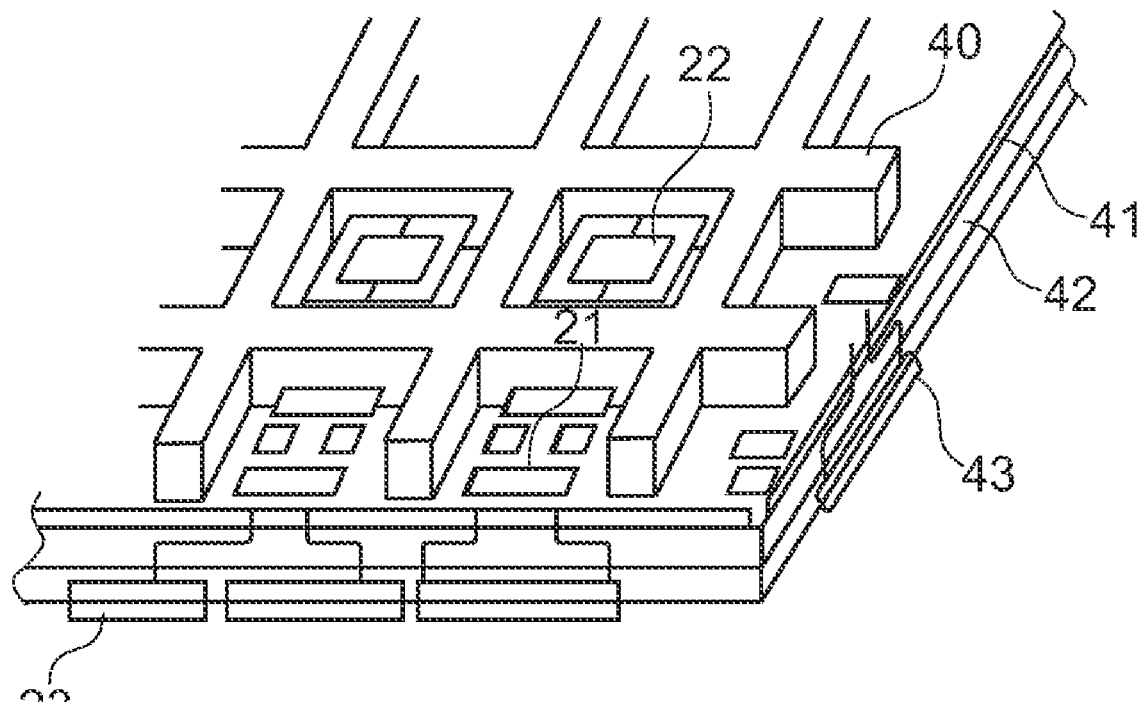
FIG. 5 is a perspective view of a device in a 4-wafer embodiment.
Figure 6:
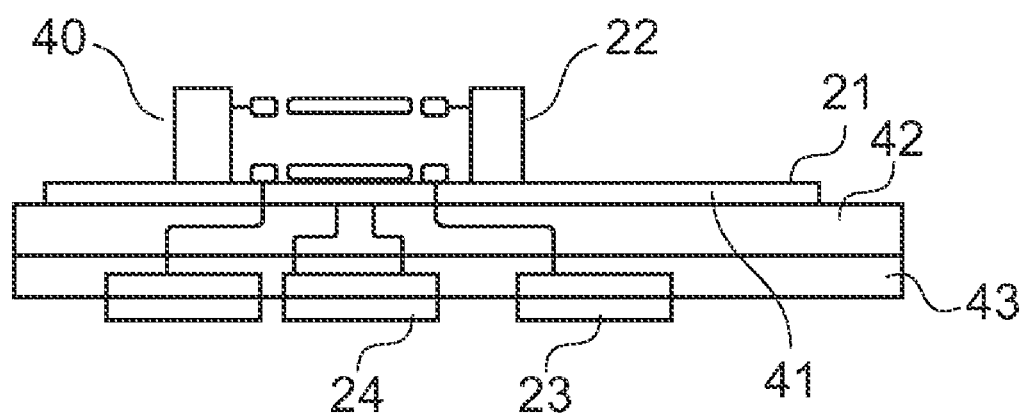
FIG. 6 is a side view of the device of FIG. 5.

FIGS. 5 and 6 show a perspective view and a side view of a 4-wafer embodiment of an inventive device. Wafers 40 to 43 can be separate wafers (e.g., silicon substrates) or layers from common wafers.

As can be seen in FIGS. 5 and 6, the first layer or the first wafer 40 includes the micro-mirrors 22. The actuators are provided in the underlying layer or the underlying wafer 41. The actuators can, for example, be in the form of electrodes for actuating the mirrors. The third layer or the third wafer 42 includes a so-called cabling or routing or wiring layer, in which the corresponding connections between the actuators of the actuator layer or of the actuator wafer 41 and the underlying ASIC wafers or the corresponding ASIC layer 43 are provided.

The integrated circuit or the electronics 23 with memory storage units 24 is provided in the ASIC layer or the ASIC wafer 43.

The mirror layer or the mirror wafer 40 can be further subdivided into a sub-layer, which contains the actual micro-mirrors 22, and a second sub-layer, which comprises the mirror mount with corresponding jointed structures.

Similarly, the third functional level in the form of the wiring wafer 42 can be sub-divided into several sub-layers so that the complex wiring may be facilitated. Accordingly, the overall structure can be effected in multiple layers or across several wafers.

Through the provision or assignment of memory storage units 24 with pre-stored parameters for setting the actuators or the components of the light modulation device actuated by them, it is possible not only to enable very rapid switching of the components of the light modulation device (e.g., the micro-mirrors 22 of a multi-mirror array) but also to facilitate flexible deployment of the light modulation device because changes can be made continuously to the stored parameters during operation. Thus, in the case of at least two stored parameters for each of one actuator or actuator group, the parameter not being used at that point can be replaced by another that is to be used in the future, e.g., the next step.

Although certain devices have been described in which an actuator is provided for each component of a light modulation device (e.g., a micro-mirror of a multi-mirror array), several actuators can be provided for a component of a light modulation device (e.g., a micro-mirror of a multi-mirror array). Individual memory storage units or a common memory storage unit for the group of several actuators can be assigned to each of the multiple actuators of a corresponding light modulation component.

Although certain devices have been described as including multi-mirror arrays in MEMS technology, other light modulation devices or micro-mechanical or electromechanical components can be used.

The following patents and applications are incorporated by reference herein: DE 103 43 333 A1; DE 10 2007 014 699.1; EP 914626; WO 98/04959; U.S. Pat. No. 7,061,582 B1; and U.S. Pat. No. 7,053,987 B2.

Although certain embodiments have been described in detail, modifications or changes, particularly as regards different combinations of individual features or the omission of individual features, are possible, without departing from the protective scope of the enclosed patent claims. The scope of protection of the claims is not to be restricted to the embodiments.

The invention claimed is:

1. A system, comprising:
    a plurality of actuators;
    a controller adapted to control the plurality of actuators; and
    a plurality of memory storage units,
    wherein:
        each of the plurality of actuators is in communication with a corresponding one of the plurality of memory storage units;
        each of the plurality of memory storage units is adapted to store a parameter corresponding to a position of its corresponding actuator;
        during use of the system, each of the plurality of actuators is operated based on data received directly from its corresponding memory storage unit; and
        the system is a projection exposure system for micro lithography.

2. The system of claim 1, wherein, for each of the plurality of memory storage units, the parameter comprises a control signal adapted to control movement of its corresponding actuator.

3. The system of claim 1, wherein the system comprises a sub-controller in communication with the controller.

4. The system of claim 1, wherein the controller is in the form of a regulating unit.

5. The system of claim 1, wherein the controller comprises an integrated circuit adapted to transmit control signals to each of the plurality of actuators.

6. The system of claim 1, wherein the plurality of memory storage units is part of an integrated circuit.

7. The system of claim 1, wherein, for each of the plurality of memory storage units, the parameter stored in the memory storage unit is directly available for controlling its corresponding actuator.

8. The system of claim 1, wherein the plurality of memory storage units is a plurality of non-volatile memory storage units.

9. The system of claim 1, wherein the plurality of memory storage units comprises memory selected from the group consisting of RAM, SRAM, DRAM, SDRAM, ROM, EPROM, EEPROM and FLASH memory.

10. The system of claim 1, wherein the plurality of actuators is in the form of an MEMS (micro-electromechanical system) unit.

11. The system of claim 1, wherein the system comprises one or more wafer systems selected from the group consisting of a 1-wafer system, a 2-wafer system, a 3-wafer system, and a 4-wafer system.

12. The system of claim 1, wherein the plurality of actuators is part of a manipulation system for at least one device selected from the group consisting of a projection device, a projection exposure system for micro-lithography, light modulators, spatial light modulators (SLMs), and multi-mirror arrays (MMAs).

13. The system of claim 1, wherein the plurality of actuators is capable of positioning up to 6 million mirrors.

14. The system of claim 1, wherein the plurality of actuators is capable of positioning up to 4 million mirrors.

15. The system of claim 1, wherein the plurality of actuators is capable of positioning from 4,000 to 1,000,000 mirrors.

16. The system of claim 1, wherein each of the plurality of actuators is individually controllable via the controller.

17. The system of claim 1, further comprising additional memory storage units so that each of the plurality of actuators is in communication with at least two memory storage units.

18. The system of claim 1, wherein each of the plurality of memory storage units is adapted to store a plurality of parameters corresponding to different positions of its corresponding actuator.

19. The system of claim 1, further comprising a plurality of subcontrollers, each of the subcontrollers being in communication with the controller and one of the plurality of actuators.

20. The system of claim 1, further comprising an illumination optic, wherein the plurality of actuators and the plurality of memory storage units are provided in the illumination optic.

21. The system of claim 1, further comprising a projection objective, wherein the plurality of actuators and the plurality of memory storage units are provided in the projection objective.

22. The system of claim 1, further comprising an illumination device.

23. The device of claim 1, wherein each of the plurality of actuators is coupled to a mirror and is capable of moving the mirror.

24. The device of claim 1, wherein each of the plurality of memory storage units is adapted to store a first parameter and a second parameter, the first parameter associated with a first position of one of the plurality of actuators and the second parameter associated with a second position of one of the plurality of actuators.

25. A method comprising:
    providing a projection exposure system comprising the system of claim 1;
    illuminating a reticle in an object plane of the projection exposure system;
    imaging the reticle onto a wafer disposed in an image plane of the projection exposure system to make semiconductor components.

* * * * *

UNITED STATES PATENT AND TRADEMARK OFFICE
CERTIFICATE OF CORRECTION

PATENT NO. : 8,102,506 B2  
APPLICATION NO. : 12/146186  
DATED : January 24, 2012  
INVENTOR(S) : Thomas Rohe Page 1 of 1

It is certified that error appears in the above-identified patent and that said Letters Patent is hereby corrected as shown below:

Column 5,
Line 32, delete "swivellable" and insert --swivelable--

Signed and Sealed this
Third Day of April, 2012

David J. Kappos
*Director of the United States Patent and Trademark Office*